(12) United States Patent
Shimizu

(10) Patent No.: US 7,545,688 B2
(45) Date of Patent: Jun. 9, 2009

(54) SEMICONDUCTOR DEVICE

(75) Inventor: Hiroshi Shimizu, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 27 days.

(21) Appl. No.: 11/529,316

(22) Filed: Sep. 29, 2006

(65) Prior Publication Data

US 2007/0220452 A1    Sep. 20, 2007

(30) Foreign Application Priority Data

Mar. 17, 2006    (JP) .............................. 2006-075040

(51) Int. Cl.
*G11C 7/00*    (2006.01)
(52) U.S. Cl. ............... 365/200; 365/225.7; 365/230.06; 326/10; 326/12
(58) Field of Classification Search .................. 326/10, 326/12; 365/200, 225.7, 230.06
See application file for complete search history.

(56) References Cited

U.S. PATENT DOCUMENTS 5,831,993 A * 11/1998 Graef .......................... 714/727
5,982,194 A * 11/1999 Worrell ........................ 326/41
6,822,912 B2 * 11/2004 Shimizu et al. .............. 365/200
7,205,785 B1 * 4/2007 Carlson ......................... 326/8
2007/0070693 A1 * 3/2007 Nakano et al. ......... 365/185.08

FOREIGN PATENT DOCUMENTS

JP    2004-039680    2/2004

* cited by examiner

*Primary Examiner*—Vibol Tan
(74) *Attorney, Agent, or Firm*—Arent Fox LLP

(57) ABSTRACT

There is provided a semiconductor device including: plural macros each having plural normal blocks and a redundant block to be used as a replacement for a normal block; a first replacement information storage unit storing first replacement macro information to designate a macro to be subjected to the replacement out of the plural macros and first replacement block information to designate a normal block to be subjected to the replacement; a first transmission line serially connecting the plural macros; and a replacement information transmission circuit transmitting replacement information to the designated normal block in the designated macro via the first transmission line based on the first replacement macro information and the first replacement block information.

10 Claims, 5 Drawing Sheets

F I G. 5
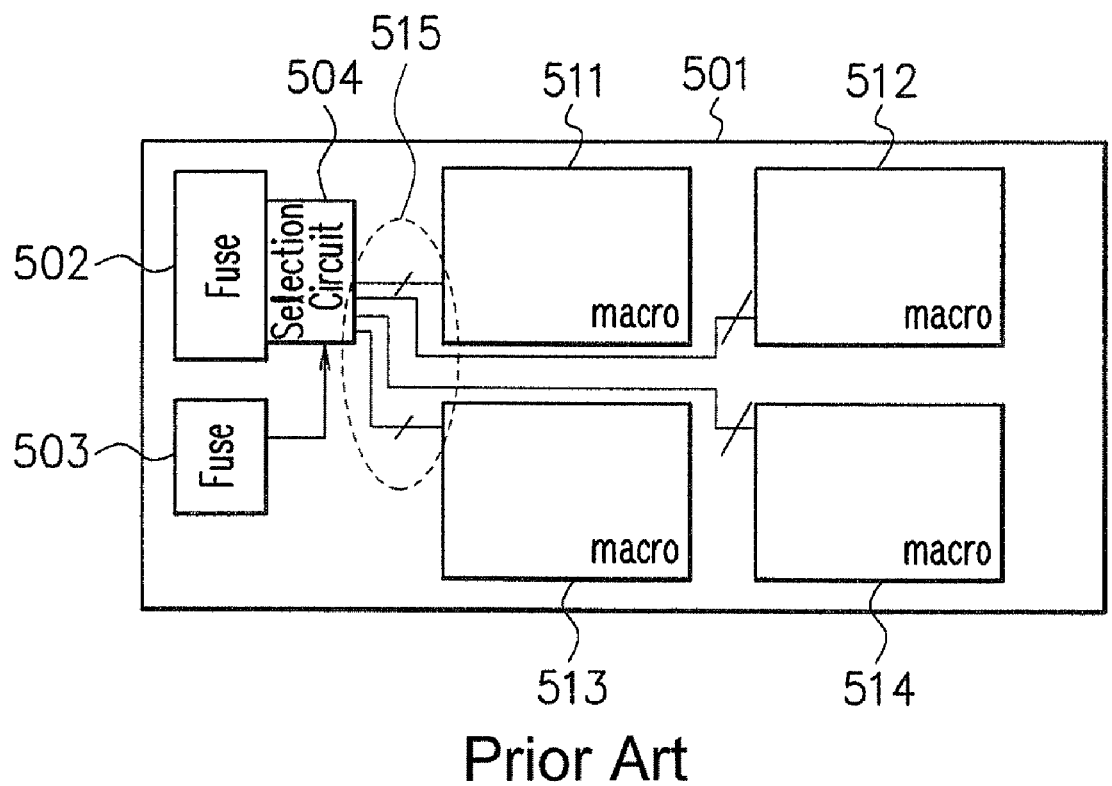
Prior Art

SEMICONDUCTOR DEVICE

CROSS-REFERENCE TO RELATED APPLICATIONS

This application is based upon and claims the benefit of priority from the prior Japanese Patent Application No. 2006-075040, filed on Mar. 17, 2006, the entire contents of which are incorporated herein by reference.

BACKGROUND OF THE INVENTION

1. Field of the Invention

The present invention relates to a semiconductor device particularly including a circuit for redundancy such as a fuse.

2. Description of the Related Art

FIG. 5 is a block diagram of a semiconductor device 501 described in the following Patent Document 1. Macros 511 to 514 are each composed of normal blocks and a redundant block. The normal block is composed of a cell array. The redundant block is composed of the same cell array as that of the normal block, and when a defect occurs in any of the normal blocks, the redundant block operates as a replacement for this block. A fuse 502 designates a normal block to be replaced with the redundant block. A fuse 503 designates a macro to be connected to the fuse 502. A selection circuit 504 selectively connects any of the macros 511 to 514 and the fuse 502 according to the state of the fuse 503.

[Patent Document 1] Japanese Patent Application Laid-open No. 2004-39680

The number of connection wirings 515 between the selection circuit 504 and the macros 511 to 514 is large. The connection wirings 515 interfere with normal signal wirings. If the macros 511 to 514 are tested simultaneously, problems such as noise and voltage drop occur due to the simultaneous operation.

SUMMARY OF THE INVENTION

An object of the present invention is to provide a semiconductor device capable of designating a normal block to be replaced with a redundant block and capable of reducing the number of connection wirings.

According to one aspect of the present invention, there is provided a semiconductor device comprising: plural macros each including plural normal blocks each composed of a circuit having some function and a redundant block having a same function as the normal block and, when a defect occurs in any of the normal blocks, used as a replacement for the normal block where the defect occurs; a first replacement information storage unit storing first replacement macro information to designate a macro to be subjected to the replacement out of the plural macros and first replacement block information to designate a normal block to be replaced with the redundant block out of the plural normal blocks in the designated macro; a first transmission line serially connecting the plural macros; and a replacement information transmission circuit transmitting replacement information to the designated normal block in the designated macro via the first transmission line based on the first replacement macro information and the first replacement block information stored in the first replacement information storage unit.

BRIEF DESCRIPTION OF THE DRAWINGS

FIG. 5 is a block diagram of a semiconductor device described in Patent Document 1.

DETAILED DESCRIPTION OF THE PREFERRED EMBODIMENTS

First Embodiment

Figure 1:
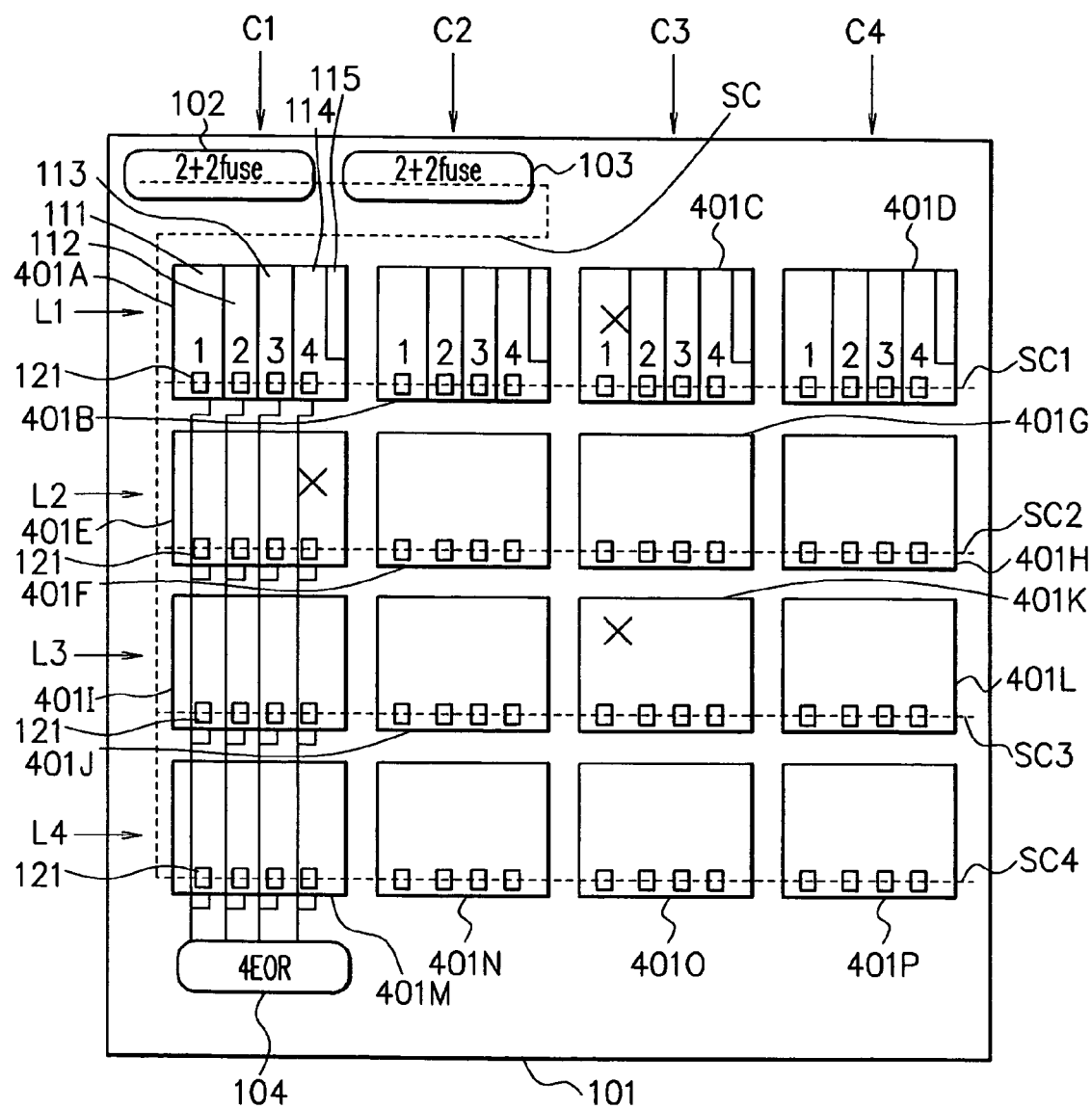
FIG. 1 is a diagram showing a configuration example of a semiconductor device according to a first embodiment of the present invention.

FIG. 1 is a diagram showing a configuration example of a semiconductor device 101 according to a first embodiment of the present invention. The semiconductor device 101 includes, for example, 16 macros 401A to 401P, fuse circuits 102 and 103, and a test circuit 104. The macros 401A to 401P are each a macro of a memory device such as an SRAM. Each of the macros 401A to 410P includes, for example, four normal blocks 111 to 114 and one redundant block 115. The first to fourth normal blocks 111 to 114 are each composed of a circuit having some function. The redundant block 115 has the same function as the normal blocks 111 to 114, and it is a block, when a defect occurs in any of the normal blocks 111 to 114, used as a replacement for the normal block where the defect occurs. For example, the normal blocks 111 to 114 and the redundant block 115 each include a memory cell array to store data. In each of the normal blocks 111 to 114, a flip-flop 121 corresponding thereto is provided.

A first row L1 is composed of the macros 401A, 401B, 401C, and 401D. A second row L2 is composed of the macros 401E, 401F, 401G, and 401H. A third row L3 is composed of the macros 401I, 401J, 401K, and 401L. A fourth row L4 is composed of the macros 401M, 401N, 401O, and 401P.

A first column C1 is composed of the macros 401A, 401E, 401I, and 401M. A second column C2 is composed of the macros 401B, 401F, 401J, and 401N. A third column C3 is composed of the macros 401C, 401G, 401K, and 401O. A fourth column C4 is composed of the macros 401D, 401H, 401L, and 401P.

A transmission line SC is connected to the fuse circuits 102 and 103. Transmission lines SC1, SC2, SC3, and SC4 are connected as scan chains in parallel to the transmission line SC.

The transmission line SC1 serially connects the macros 401A, 401B, 401C, and 401D of the first row L1. The normal blocks 111 to 114 in the macros 401A, 401B, 401C, and 401D are serially connected by the transmission line SC1. The flip-flops 121 in the macros 401A, 401B, 401C, and 401D are serially connected and serially transmit replacement information by the transmission line SC1.

The transmission line SC2 serially connects the macros 401E, 401F, 401G, and 401H of the second row L2. The normal blocks 111 to 114 in the macros 401E, 401F, 401G, and 401H are serially connected by the transmission line SC2. The flip-flops 121 in the macros 401E, 401F, 401G, and 401H are serially connected and serially transmit the replacement information by the transmission line SC2.

The transmission line SC3 serially connects the macros 401I, 401J, 401K, and 401L of the third row L3. The normal blocks 111 to 114 in the macros 401I, 401J, 401K, and 401L are serially connected by the transmission line SC3. The flip-flops 121 in the macros 401I, 401J, 401K, and 401L are serially connected and serially transmit the replacement information by the transmission line SC3.

The transmission line SC4 serially connects the macros 401M, 401N, 401O, and 401P of the fourth row L4. The normal blocks 111 to 114 in the macros 401M, 401N, 401O, and 401P are serially connected by the transmission line SC4. The flip-flops 121 in the macros 401M, 401N, 401O, and 401P are serially connected and serially transmit the replacement information by the transmission line SC4.

Incidentally, although a detailed description will be given later referring to FIG. 2, in addition to the transmission lines SC and SC1 to SC4, clock signal lines to transmit the replacement information are connected to the flip-flops 121.

The fuse circuit 102 includes a fuse which stores first replacement macro information (2 bits) to designate macros of one column to be subjected to the replacement out of macros of, for example, four columns C1 to C4 and first replacement block information (2 bits) to designate a normal block to be replaced with the redundant block 115 out of, for example, four normal blocks 111 to 114 in the designated macros. The fuse includes four (4-bit) fuse elements and can store the first replacement macro information and the first replacement block information by blowing any of the fuse elements by a laser beam.

Similarly, the fuse circuit 103 includes a fuse which stores second replacement macro information (2 bits) to designate macros of one column to be subjected to the replacement out of macros of, for example, four columns C1 to C4 and second replacement block information (2 bits) to designate a normal block to be replaced with the redundant block 115 out of, for example, four normal blocks 111 to 114 in the designated macros. The fuse includes four (4-bit) fuse elements and can store the second replacement macro information and the second replacement block information by blowing any of the fuse elements by a laser beam.

By providing two fuse circuits 102 and 103, even when defects occur respectively in normal blocks of two macros, the normal blocks where the defects occur can be each replaced with the redundant block 115. For example, a case where a defect occurs in each of the fourth normal block 114 in the macro 401E and the first normal block 111 in the macro 401K will be described as an example.

The fuse circuit 102 stores macros of the first column C1 as the first replacement macro information and the fourth normal block 114 as the first replacement block information. The fuse circuit 103 stores macros of the third column C3 as the second replacement macro information and the first normal block 111 as the second replacement block information.

A replacement information transmission circuit transmits the replacement information to the specified normal blocks in the specified macros via the transmission lines SC and SC1 to SC4 based on the first replacement macro information and the first replacement block information stored in the fuse circuit 102. The replacement information is stored in the flip-flops 121 corresponding to the fourth normal blocks 114 in the macros 401A, 401E, 401I, and 401M of the first column C1. The normal blocks 111 to 114 each include a memory cell array and an input/output circuit. An operation in each of the macros 401A, 401E, 401I, and 401M of the first column C1 will be described below. The input/output circuits in the first to third normal blocks 111 to 113 are connected to the memory cell arrays in the first to third normal blocks 111 to 113, respectively. The memory cell array in the fourth normal block 114 is separated. The input/output circuit in the fourth normal block 114 is connected to the memory cell array in the redundant block 115. Consequently, the memory cell array in the fourth normal block 114 is replaced with the memory cell array in the redundant block 115.

Similarly, the replacement information transmission circuit transmits the replacement information to the specified normal blocks in the specified macros via the transmission lines SC and SC1 to SC4 based on the second replacement macro information and the second replacement block information stored in the fuse circuit 103. The replacement information is stored in the flip-flops 121 corresponding to the first normal blocks 111 in the macros 401C, 401G, 401K, and 401O of the third column C3. The normal blocks 111 to 114 each includes a memory cell array and an input/output circuit. An operation in each of the macros 401C, 401G, 401K, and 401O of the third column C3 will be described below. The memory cell array in the first normal block 111 is separated. The input/output circuit in the first normal block 111 is connected to the memory cell array in the second normal block 112. The input/output circuit in the second normal block 112 is connected to the memory cell array in the third normal block 113. The input/output circuit in the third normal block 113 is connected to the memory cell array in the fourth normal block 114. The input/output circuit in the fourth normal block 114 is connected to the memory cell array in the redundant block 115. Consequently, the memory cell array in the first normal block 111 is replaced with the memory cell array in the redundant block 115.

A case where defects occur in the fourth normal block 114 in the macro 401E, the first normal block 111 in the macro 401K, and the first normal block 111 in the macro 401C will be considered. In this case, defects occur in three places but can be remedied by replacement by the above method. Namely, each of the normal blocks 111 of four macros 401C, 401G, 401K, 401O of the third column C3 is replaced with the redundant block 115, so that the defects in the normal blocks 111 of the macros 401C and 401K are remedied. Although rare, this case can be remedied.

As described above, in this embodiment, switching to the redundant block 115 is performed on a column-by-column basis. Normally, a defect (fault) occurs in the ratio of one to several tens of macros, and therefore two fuse circuits 102 and 103 are enough. Note, however, that the number of fuse circuits is not limited two, and may be one, or three or more.

Figure 2:
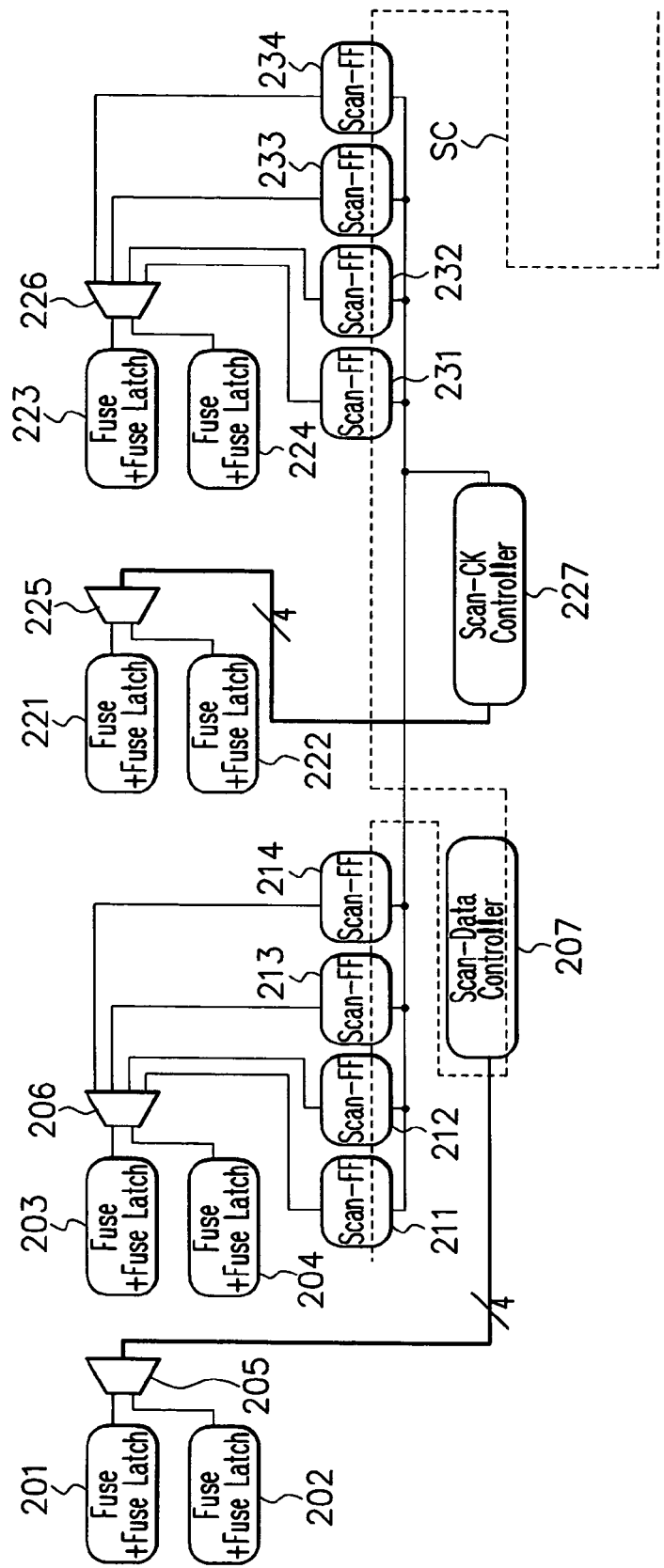
FIG. 2 is a diagram showing a configuration example of fuse circuits and a replacement information transmission circuit.

FIG. 2 is a diagram showing a configuration example of the fuse circuits 102 and 103 and the replacement information transmission circuit. Fuse circuits 201 to 204 correspond to the fuse circuit 102 in FIG. 1. The fuse circuits 201 and 202 include each a fuse and a latch circuit and store the 2-bit first replacement macro information. A decoder 205 decodes the 2-bit first replacement macro information stored in the fuse circuits 201 and 202 and outputs it to a scan data controller 207 while any one of four lines is driven high and the remaining lines are driven low.

The fuse circuits 203 and 204 include each a fuse and a latch circuit and store the 2-bit first replacement block information. A decoder 206 decodes the 2-bit first replacement block information stored in the fuse circuits 203 and 204 and outputs it to four scan flip-flops 211 to 214 while any one of four lines is driven high and the remaining lines are driven low.

Fuse circuits 221 to 224 correspond to the fuse circuit 103 in FIG. 1. The fuse circuits 221 and 222 include each a fuse and a latch circuit and store the 2-bit second replacement macro information. A decoder 225 decodes the 2-bit second replacement macro information stored in the fuse circuits 221 and 222 and outputs it to a scan clock controller 227 while any one of four lines is driven high and the remaining lines are driven low.

The fuse circuits 223 and 224 include each a fuse and a latch circuit and store the 2-bit second replacement block information. A decoder 226 decodes the 2-bit second replacement block information stored in the fuse circuits 223 and 224 and outputs it to four scan flip-flops 231 to 234 while any one of four lines is driven high and the remaining lines are driven low.

The transmission line SC serially connects the flip-flops 211 to 214, the data controller 207, and the flip-flops 231 to 234. The clock controller 227 outputs a clock signal to clock terminals of the flip-flops 211 to 214 and 231 to 234.

First, an example in which only macros of one column are designated using the fuse circuits 221 to 214 without using the fuse circuits 201 to 214 will be described.

The fuse circuits 223 and 224 store the second replacement block information. When the first normal block 111 is replaced with the redundant block 115, 00 (binary number) is stored in the fuse circuits 223 and 224. Then, a high level (replacement information) is stored in the flip-flop 231, and a low level is stored in the flip-flops 232 to 234.

When the second normal block 112 is replaced with the redundant block 115, 01 (binary number) is stored in the fuse circuits 223 and 224. Then, the high level (replacement information) is stored in the flip-flop 232, and the low level is stored in the flip-flops 231, 233, and 234.

When the third normal block 113 is replaced with the redundant block 115, 10 (binary number) is stored in the fuse circuits 223 and 224. Then, the high level (replacement information) is stored in the flip-flop 233, and the low level is stored in the flip-flops 231, 232, and 234.

When the fourth normal block 114 is replaced with the redundant block 115, 11 (binary number) is stored in the fuse circuits 223 and 224. Then, the high level (replacement information) is stored in the flip-flop 234, and the low level is stored in the flip-flops 231 to 233.

The fuse circuits 221 and 222 store the second replacement macro information. When macros of the first column C1 are subjected to replacement, 00 (binary number) is stored in the fuse circuits 221 and 222. Then, the clock controller 227 outputs four clock pulses. Thereby, storage contents of the flip-flops 231 to 234 are shifted to and stored in the flip-flops 121 corresponding to the normal blocks 111 to 114 of the macros 401A, 401E, 401I, and 401M of the first column C1. The normal blocks corresponding to the flip-flops 121 in which the replacement information is stored are replaced with the redundant blocks 115.

When macros of the second column C2 are subjected to replacement, 01 (binary number) is stored in the fuse circuits 221 and 222. Then, the clock controller 227 outputs eight clock pulses. Thereby, the storage contents of the flip-flops 231 to 234 are shifted to and stored in the flip-flops 121 corresponding to the normal blocks 111 to 114 of the macros 401B, 401F, 401J, and 401N of the second column C2. The normal blocks corresponding to the flip-flops 121 in which the replacement information is stored are replaced with the redundant blocks 115.

When macros of the third column C3 are subjected to replacement, 10 (binary number) is stored in the fuse circuits 221 and 222. Then, the clock controller 227 outputs 12 clock pulses. Thereby, the storage contents of the flip-flops 231 to 234 are shifted to and stored in the flip-flops 121 corresponding to the normal blocks 111 to 114 of the macros 401C, 401G, 401K, and 401O of the third column C3. The normal blocks corresponding to the flip-flops 121 in which the replacement information is stored are replaced with the redundant blocks 115.

When macros of the fourth column C4 are subjected to replacement, 11 (binary number) is stored in the fuse circuits 221 and 222. Then, the clock controller 227 outputs sixteen clock pulses. Thereby, the storage contents of the flip-flops 231 to 234 are shifted to and stored in the flip-flops 121 corresponding to the normal blocks 111 to 114 of the macros 401D, 401H, 401L, and 401P of the fourth column C4. The normal blocks corresponding to the flip-flops 121 in which the replacement information is stored are replaced with the redundant blocks 115.

As described above, second replacement information can be transmitted to normal blocks of macros of one column designated by the second replacement macro information and the second replacement block information. Next, an example in which macros of two columns are designated using the fuse circuits 201 to 204 and the fuse circuits 221 to 214 will be described. First replacement information is transmitted to normal blocks in macros of one column designated by the first replacement macro information and the first replacement block information, and the second replacement information is transmitted to normal blocks in macros of another column designated by the second replacement macro information and the second replacement block information.

The fuse circuits 203 and 204 store the first replacement block information. When the first normal block 111 is replaced with the redundant block 115, 00 (binary number) is stored in the fuse circuits 203 and 204. Then, the high level (replacement information) is stored in the flip-flop 211, and the low level is stored in the flip-flops 212 to 214.

When the second normal block 112 is replaced with the redundant block 115, 01 (binary number) is stored in the fuse circuits 203 and 204. Then, the high level (replacement information) is stored in the flip-flop 212, and the low level is stored in the flip-flops 211, 213, and 214.

When the third normal block 113 is replaced with the redundant block 115, 10 (binary number) is stored in the fuse circuits 203 and 204. Then, the high level (replacement information) is stored in the flip-flop 213, and the low level is stored in the flip-flops 211, 212, and 214.

When the fourth normal block 114 is replaced with the redundant block 115, 11 (binary number) is stored in the fuse circuits 203 and 204. Then, the high level (replacement information) is stored in the flip-flop 214, and the low level is stored in the flip-flops 211 to 213.

The fuse circuits 201 and 202 store the first replacement macro information. The first replacement macro information designates a relative position with respect to macros of the column designated by the second replacement macro information. The second replacement macro information is stored in the fuse circuits 221 and 222. When the first replacement macro information designates macros of a column on the left next to macros of the column designated by the second macro information, the fuse circuits 201 and 202 store 00 (binary number). When the first replacement macro information designates macros of a column on the left next but one to macros of the column designated by the second macro information, the fuse circuits 201 and 202 store 01 (binary number). When the first replacement macro information designates macros of a column on the left next but two to macros of the column designated by the second macro information, the fuse circuits 201 and 202 store 10 (binary number).

For example, when the first replacement macro information designates the first column C1 and the second replacement macro information designates the second column C2, the first replacement macro information is 00 (binary number), and the second replacement macro information is 01 (binary number).

When the first replacement macro information designates the first column C1 and the second replacement macro information designates the third column C3, the first replacement macro information is 01 (binary number), and the second replacement macro information is 10 (binary number).

When the first replacement macro information designates the first column C1 and the second replacement macro information designates the fourth column C4, the first replacement macro information is 10 (binary number), and the second replacement macro information is 11 (binary number).

When the first replacement macro information designates the second column C2 and the second replacement macro information designates the third column C3, the first replacement macro information is 00 (binary number), and the second replacement macro information is 10 (binary number).

When the first replacement macro information designates the second column C2 and the second replacement macro information designates the fourth column C4, the first replacement macro information is 01 (binary number), and the second replacement macro information is 11 (binary number).

When the first replacement macro information designates the third column C3 and the second replacement macro information designates the fourth column C4, the first replacement macro information is 00 (binary number), and the second replacement macro information is 11 (binary number).

When 00 (binary number) is stored in the fuse circuits 201 and 202, the data controller 207 serially arranges data stored in the flip-flops 211 to 214 and data stored in the flip-flops 231 to 234 and transmits them on the transmission line SC.

When 01 (binary number) is stored in the fuse circuits 201 and 202, the data controller 207 inserts four low-level data between the data stored in the flip-flops 211 to 214 and the data stored in the flip-flops 231 to 234 and serially transmits them on the transmission line SC.

When 10 (binary number) is stored in the fuse circuits 201 and 202, the data controller 207 inserts eight low-level data between the data stored in the flip-flops 211 to 214 and the data stored in the flip-flops 231 to 234 and serially transmits them on the transmission line SC.

Further, when 00 (binary data) is stored in the fuse circuits 221 and 222, the clock controller 227 outputs four clock pulses to the flip-flops 211 to 214 and 231 to 234. Thereby, the storage contents of the flip-flops 211 to 214 and 231 to 234 are shifted by four flip-flops and stored in other serially connected flip-flops. The storage contents of the flip-flops 231 to 234 are shifted to and stored in the flip-flops 121 corresponding to the normal blocks 111 to 114 of macros of the first column C1.

When 01 (binary data) is stored in the fuse circuits 221 and 222, the clock controller 227 outputs eight clock pulses to the flip-flops 211 to 214 and 231 to 234. Thereby, the storage contents of the flip-flops 211 to 214 and 231 to 234 are shifted by eight flip-flops and stored in other serially connected flip-flops. The storage contents of the flip-flops 231 to 234 are shifted to and stored in the flip-flops 121 corresponding to the normal blocks 111 to 114 of macros of the second column C2.

When 10 (binary data) is stored in the fuse circuits 221 and 222, the clock controller 227 outputs 12 clock pulses to the flip-flops 211 to 214 and 231 to 234. Thereby, the storage contents of the flip-flops 211 to 214 and 231 to 234 are shifted by 12 flip-flops and stored in other serially connected flip-flops. The storage contents of the flip-flops 231 to 234 are shifted to and stored in the flip-flops 121 corresponding to the normal blocks 111 to 114 of macros of the third column C3.

When 11 (binary data) is stored in the fuse circuits 221 and 222, the clock controller 227 outputs 16 clock pulses to the flip-flops 211 to 214 and 231 to 234. Thereby, the storage contents of the flip-flops 211 to 214 and 231 to 234 are shifted by 16 flip-flops and stored in other serially connected flip-flops. The storage contents of the flip-flops 231 to 234 are shifted to and stored in the flip-flops 121 corresponding to the normal blocks 111 to 114 of macros of the fourth column C4.

As described above, normal blocks of macros of a column to which the first replacement information is transmitted are each replaced with a redundant block, and normal blocks of macros of another column to which the second replacement information is transmitted are also each replaced with a redundant block. Incidentally, even if replacement is made regardless of the presence or absence of a defect in the normal block, there is no inconvenience, and hence, there is no problem even if normal blocks of two columns are always replaced.

According to this embodiment, the replacement information transmission circuit transmits the replacement information to the specified blocks in the specified macros, respectively, via the transmission lines SC and SC1 to SC4 based on the replacement macro information and the replacement block information stored in the fuse circuits (replacement information storage unit) 102 and 103.

More specifically, the replacement information transmission circuit transmits the replacement information in parallel to the normal blocks in the macros of the first row L1 to the fourth row L4 via the transmission lines SC and SC1 to SC4 based on the replacement macro information and the replacement block information stored in the fuse circuits 102 and 103.

When a semiconductor device 501 in FIG. 5 includes 64 macros and a fuse 502 includes eight fuse elements, 8×64=512 connection wirings 515 are needed. In contrast, in this embodiment, only one transmission line (scan chain) is required, which makes it possible to reduce the number of connection wirings and reduce the wiring area.

Figure 3:
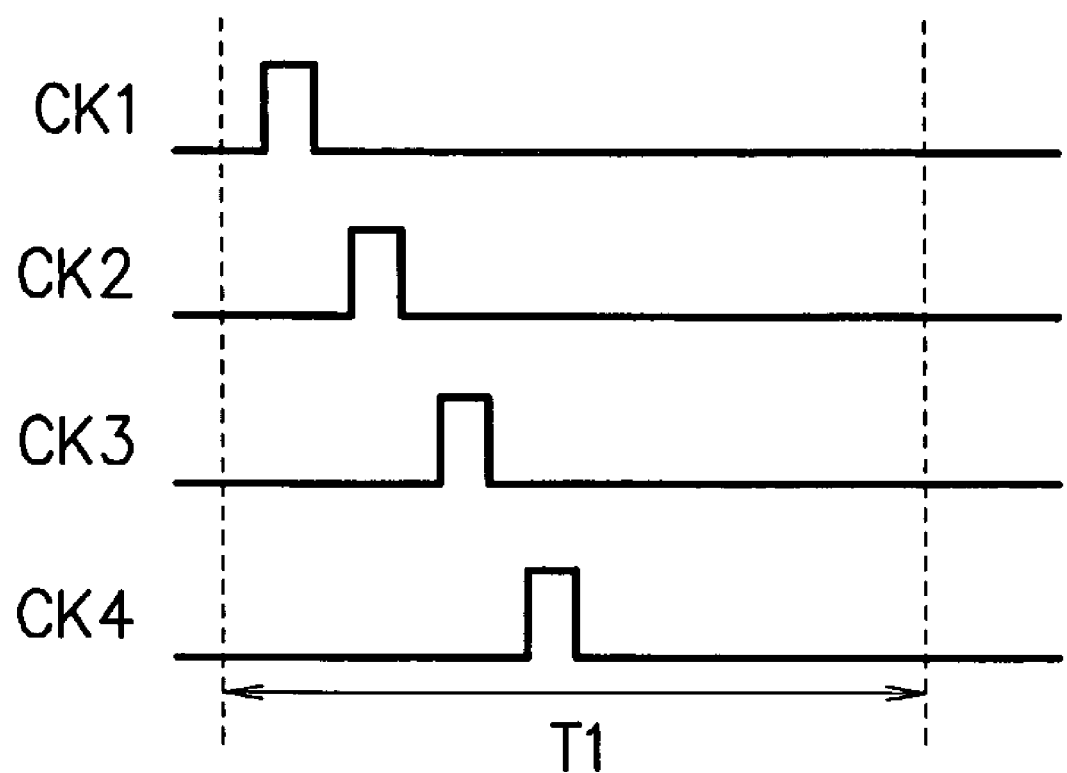
FIG. 3 is a timing chart showing a test method using a test circuit.

FIG. 3 is a timing chart showing a test method using the test circuit 104 in FIG. 1. A test period T1 is, for example, 100 ns. The phases of clock signals CK1, CK2, CK3, and CK4 are different (shifted) each by 10 ns in the test period T1. The test is performed on a column-by-column basis. The test circuit (test read circuit) 104 stores an output signal of the first normal block 111 of the macro 401A in the first flip-flop in synchronization with the clock signal CK1, stores an output signal of the first normal block 111 of the macro 401E in the second flip-flop in synchronization with the clock signal CK2, stores an output signal of the first normal block 111 of the macro 401I in the third flip-flop in synchronization with the clock signal CK3, stores an output signal of the first normal block 111 of the macro 401M in the fourth flip-flop in synchronization with the clock signal CK4, and calculates and outputs an exclusive OR of four data stored in first to fourth flip-flops. The output result becomes 0 if all the four data are the same and becomes 1 if all the four data are not the same. Thus, data stored in memory cells in the normal block can be tested.

Moreover, the second to fourth normal blocks 112 to 114 in macros of the first column C1 can be tested in the same manner. Further, the second to fourth columns C2 to C4 can be also tested in the same manner.

If the phases of the four clock signals CK1 to CK4 are made the same, data are stored in the first to fourth flip-flops in the same timing, and noise and a voltage drop occur. In this embodiment, by shifting the phases of the four clock signals CK1 to CK4, data can be stored in the first to fourth flip-flops in different timings, so that noise and a voltage drop can be prevented. By storing data in the first to fourth flip-flops within the test period T1, an increase in test time can be prevented.

Second Embodiment

Figure 4:
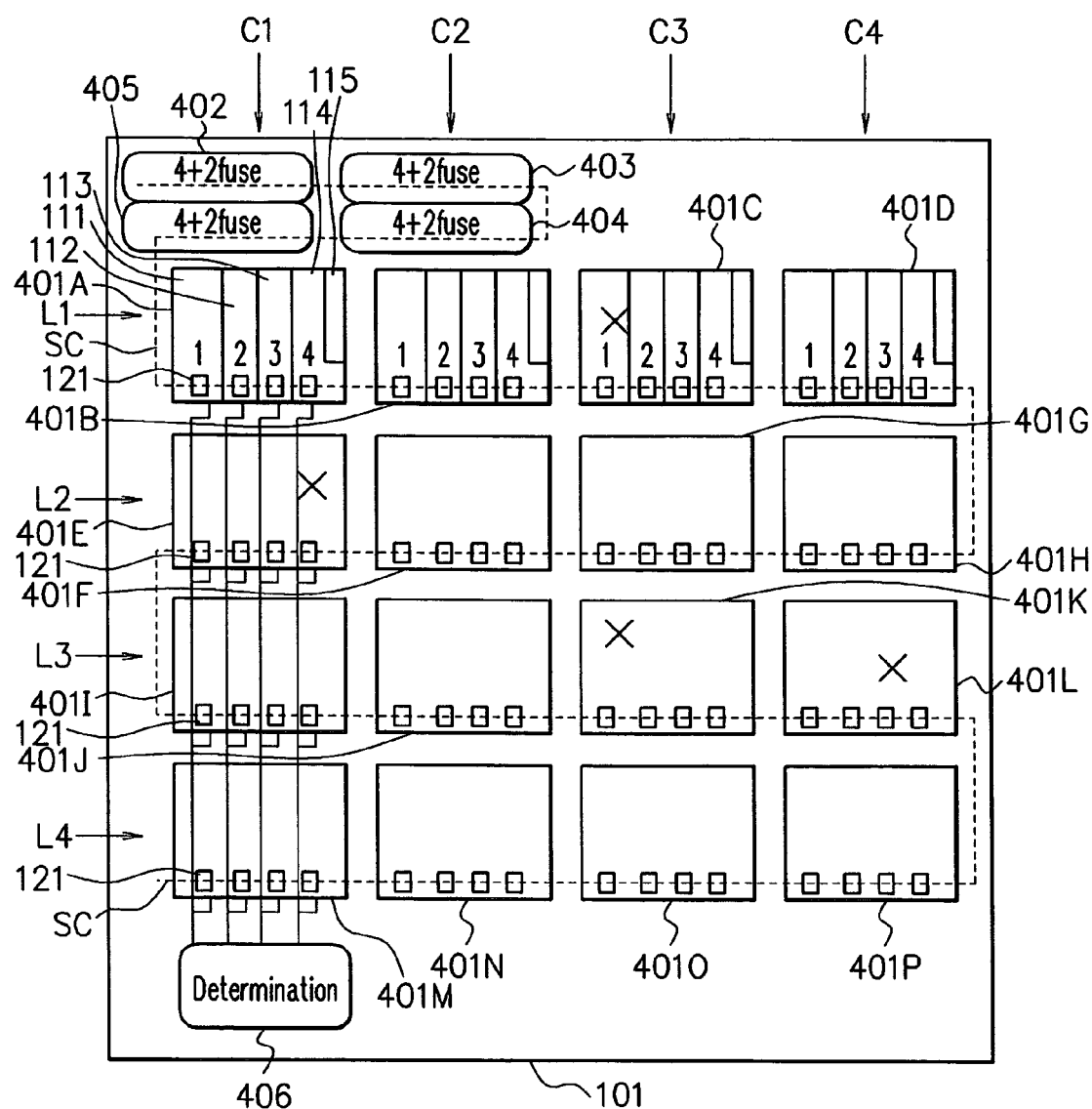
FIG. 4 is a diagram showing a configuration example of a semiconductor device according to a second embodiment of the present invention.

FIG. 4 is a diagram showing a configuration example of the semiconductor device 101 according to a second embodiment of the present invention. Points of the second embodiment (FIG. 4) different from the first embodiment (FIG. 1) will be described. Four fuse circuits 402 to 405 are connected to the transmission line SC. Sixteen macros 401A to 401P are serially connected to the transmission line SC. The replacement information is serially transmitted to the 16 macros 401A to 401P. The fuse circuits 402 to 405 and the replacement information transmission circuit have the same configuration as in FIG. 2.

As in FIG. 2, in addition to the transmission line SC, clock signal lines to transmit the replacement information are connected to the flip-flops 121.

The fuse circuit 402 includes a fuse which stores first replacement macro information (4 bits) to designate a macro to be subjected to the replacement out of, for example, 16 macros 401A to 401P and first replacement block information (2 bits) to designate a normal block to be replaced with the redundant block 115 out of, for example, four normal blocks 111 to 114 in the designated macro.

Similarly, the fuse circuit 403 includes a fuse which stores second replacement macro information (4 bits) and second replacement block information (2 bits). The fuse circuit 404 includes a fuse which stores third replacement macro information (4 bits) and third replacement block information (2 bits). The fuse circuit 405 includes a fuse which stores fourth replacement information (4 bits) and fourth replacement block information (2 bits).

In this first embodiment, macros to be subjected to replacement are designated on a column-by-column basis, but in this embodiment, a macro to be subjected to replacement can be designated on a macro-by-macro basis. Consequently, normal blocks of any four macros can be replaced. For example, the first normal block 111 of the macro 401C, the fourth normal block 114 of the macro 401E, the first normal block 111 of the macro 401K, and the third normal block 113 of the macro 401L can be designated and replaced by the fuse circuit 402, the fuse circuit 403, the fuse circuit 404, and the fuse circuit 405, respectively.

In this embodiment, as in the first embodiment, the replacement information can be transmitted by one transmission line (scan chain), which makes it possible to reduce the number of connection wirings and reduce the wiring area.

In this embodiment, the phases of the four clock signals CK1 to CK4 in FIG. 3 are shifted each by 20 ns, and the test is performed on a column-by-column basis. A test circuit 406 stores an output signal of the first normal block 111 of the macro 401A in the first flip-flop in synchronization with the clock signal CK1, stores an output signal of the first normal block 111 of the macro 401E in the second flip-flop in synchronization with the clock signal CK2, stores an output signal of the first normal block 111 of the macro 401I in the third flip-flop in synchronization with the clock signal CK3, stores an output signal of the first normal block 111 of the macro 401M in the fourth flip-flop in synchronization with the clock signal CK4, and determines data in the first to fourth flip-flops. This makes it possible to determine which of the macros 401A, 401B, 401I, and 401M is faulty.

Moreover, the second to fourth normal blocks 112 to 114 of macros of the first column C1 can be tested in the same manner. Further, the second to fourth columns C2 to C4 can be also tested in the same manner.

In this embodiment, as in the first embodiment, by making the phases of the four clock signals CK1 to CK4 different, data can be stored in the first to fourth flip-flops in different timings, so that noise and a voltage drop can be prevented. By storing data in the first to fourth flip-flops within the test period T1, an increase in test time can be prevented.

It is to be understood that the present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

A normal block to be replaced with a redundant block can be designated. Moreover, by serially connecting plural macros by a first transmission line, the number of connection wirings can be reduced.

What is claimed is:

1. A semiconductor device, comprising:
   plural macros each including plural normal blocks each composed of a circuit having some function and a redundant block having a same function as the normal block and, when a defect occurs in any of the normal blocks, used as a replacement for the normal block where the defect occurs;
   a first replacement information storage unit storing first replacement macro information to designate a macro to be subjected to the replacement out of the plural macros and first replacement block information to designate a normal block to be replaced with the redundant block out of the plural normal blocks in the designated macro;
   a first transmission line serially connecting the plural macros; and
   a replacement information transmission circuit transmitting replacement information to the designated normal block in the designated macro via said first transmission line based on the first replacement macro information and the first replacement block information stored in said first replacement information storage unit, wherein
   said replacement information transmission circuit includes plural flip-flops provided corresponding to the plural normal blocks in the plural macros, and
   the plural flip-flops are serially connected by said first transmission line and serially transmit the replacement information.

2. The semiconductor device according to claim 1, wherein the plural normal blocks in the macro are serially connected by said first transmission line.

3. The semiconductor device according to claim 1, wherein said first replacement information storage unit includes a fuse to store the first replacement macro information and the first replacement block information.

4. The semiconductor device according to claim 1, further comprising
   a second transmission line, wherein
   the plural macros include plural first macros and plural second macros,
   said first transmission line serially connects the plural first macros,
   said second transmission line is connected in parallel to said first transmission line and serially connects the plural second macros, and
   said replacement information transmission circuit transmits the replacement information in parallel to the normal blocks in the first and second macros via said first and second transmission lines based on the first replacement macro information and the first replacement block information stored in said first replacement information storage unit.

5. The semiconductor device according to claim 1, further comprising a second replacement information storage unit storing second replacement macro information to designate a macro to be subjected to the replacement out of the plural macros and second replacement block information to designate a normal block to be replaced with the redundant block out of the plural normal blocks in the designated macro, wherein said replacement information transmission circuit transmits the replacement information to the designated two normal blocks in the designated two macros via said first transmission line based on the first replacement macro information, the first replacement block information, the second replacement macro information, and the second replacement block information.

6. The semiconductor device according to claim 4, further comprising a test read circuit storing an output signal of the first macro in synchronization with a first clock signal and storing an output signal of the second macro in synchronization with a second clock signal having a different phase from the first clock signal.

7. The semiconductor device according to claim 1, wherein the normal block and the redundant block each include a memory cell array to store data.

8. The semiconductor device according to claim 4, further comprising a second replacement information storage unit storing second replacement macro information to designate a macro to be subjected to the replacement out of the plural macros and second replacement block information to designate a normal block to be replaced with the redundant block out of the plural blocks in the designated macro, wherein said replacement information transmission circuit transmits the replacement information to the designated two normal blocks in the designated two macros via said first transmission line based on the first replacement macro information, the first replacement block information, the second replacement macro information, and the second replacement block information.

9. The semiconductor device according to claim 4, wherein said first replacement information storage unit includes a fuse to store the first replacement macro information and the first replacement block information.

10. The semiconductor device according to claim 5, wherein said second replacement information storage unit includes a fuse to store the second replacement macro information and the second replacement block information.

* * * * *